(12) United States Patent
Abe et al.

(10) Patent No.: US 6,953,349 B2
(45) Date of Patent: Oct. 11, 2005

(54) MULTILAYER CIRCUIT BOARD FOR HIGH FREQUENCY SIGNALS

(75) Inventors: Junichi Abe, Tokyo (JP); Yuichirou Murata, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/850,427

(22) Filed: May 21, 2004

(65) Prior Publication Data

US 2004/0246064 A1 Dec. 9, 2004

(30) Foreign Application Priority Data

May 26, 2003 (JP) ........................................ 2003-147401
Jan. 15, 2004 (JP) ........................................ 2004-007938

(51) Int. Cl.[7] ............................. H01R 12/00; H05K 1/00
(52) U.S. Cl. ........................................................ 439/74
(58) Field of Search ................................ 439/74, 79, 80, 439/108, 101

(56) References Cited

U.S. PATENT DOCUMENTS 6,341,966 B1    1/2002  Takada et al.
6,866,544 B1 *  3/2005  Casey et al. ................ 439/607

FOREIGN PATENT DOCUMENTS

| JP | 11-054943  | 2/1999 |
| JP | 2000-208887| 7/2000 |
| JP | 2001-143786| 5/2001 |

* cited by examiner

*Primary Examiner*—Javaid H. Nasri
(74) *Attorney, Agent, or Firm*—Leydig, Voit & Mayer, Ltd.

(57) ABSTRACT

A multilayer circuit board for high-frequency signals includes: a multilayer wiring board unit including, at least one wiring layer, one or more ground layers configured by a conductive material, insulating layers between the layers, and a first external electrode electrically connected to a transmission line on an episurface; and a connector unit including a second external electrode electrically connected to the first external electrode, and a fitting portion for holding on the multilayer wiring board unit an external circuit board or an external connector. The distance d between the first external electrode (7) and the ground layer perpendicularly below and most closely disposed to the first external electrode is determined within the range $d_l \leq d \leq d_u$ with respect to the values $d_l$ and $d_u$ defined based on tolerance of the impedance $\Delta Z$.

4 Claims, 2 Drawing Sheets

MULTILAYER CIRCUIT BOARD FOR HIGH FREQUENCY SIGNALS

BACKGROUND OF THE INVENTION

1. Field of the Invention

The present invention relates to multilayer circuit boards for high frequency signals, and particularly to a multilayer circuit board for high frequency signals, higher in frequency than 500 MHz, and that includes a connector unit for fitting and connecting to an opposing circuit board or an opposing connector, and a multilayer wiring board unit electrically connected to the connector unit along external electrodes disposed on its surface.

2. Description of the Related Art

A conventional method of connecting circuit boards for transmitting high frequency signals has been to realize electrical connection by pressing pins electrically connected to one circuit board against external electrodes provided on the other circuit board. However, as signal transmission rates increase, efficient signal transmission has become difficult with the method of electrically connecting by pressing the pins against the external electrodes. Therefore, methods of connecting the two by adopting structures such as a BGA (ball grid array) structure and a BVH (blind via hole) structure that on either the connector or the circuit board, or both, have no pins, have been investigated. As a conventional method of matching impedances of the connector and the circuit board, which does not relate to BGAs, a method for impedance matching by changing the size of the through-hole lands to vary the capacitive component between ground in the proximity of through-holes and through-hole lands is disclosed, for example, in Japanese Laid-Open Patent Publication 208887/2000 (page 3 and FIG. 2).

In the conventional method of connecting the connector and the circuit board, impedance matching has been designed for by changing the size of the through-hole lands to vary the capacitive component between ground in the proximity of the through-holes (via holes) and the through-hole lands (lands) However, when designing for impedance matching between a circuit board transmitting high frequency signals higher than 500 MHz, such as from 500 MHz to around 5 GHz, and a connector, the BGA structure, for example, has had the following problem. The capacitance between the BGA and ground varies depending on whether a ground layer (conductive material) is present directly below the land, and such capacitance variation is no longer negligible in transmitting high frequency signals higher than 500 MHz. Therefore, it has been difficult to design for sufficient impedance matching by simply changing the size of the through-hole lands to adjust the capacitive component between ground in the proximity of the through-holes and the through-hole lands.

It is an object of the invention to realize a multilayer circuit board for high frequency signals that enables efficient transmission of high frequency signals in connecting a connector unit electrically connected to an opposing circuit board as the target for connection.

SUMMARY OF THE INVENTION

A multilayer circuit board for high frequency signals relevant to the invention includes: a multilayer wiring board unit including one or more wiring layers, the one or each of which including a transmission line for transmitting high frequency signals, one or more ground layers constituted by a conductive material, one or more insulating layers, each disposed at least between the one wiring layer or one of the wiring layers, and the one ground layer or one of the ground layers, and a first external electrode formed on the episurface of the board unit and electrically connected to the transmission line; and a connector unit including a second external electrode electrically connected to the first external electrode, and a fitting portion for retaining on the multilayer wiring board unit either an external circuit board or an external connector. And distance d between the first external electrode and the ground layer being perpendicularly below and most closely disposed to the first external electrode is within the range $d_l \leq d \leq d_u$ with respect to values $d_l$ and $d_u$ determined by the following equations:

$$d_l = \epsilon_0 \epsilon_r \pi r^2 (Z_L - \Delta Z)^2 / L_e$$

$$d_u = \epsilon_0 \epsilon_r \pi r^2 (Z_L - \Delta Z)^2 / L_e$$

where $\epsilon_0$: electric constant, $\epsilon_r$: relative permittivity, r: radius of the first or the second external electrode, whichever is greater, $Z_L$: impedance of the transmission line, $\Delta Z$: impedance tolerance, and $L_e$: sum of the inductances of the first and the second external electrodes. Therefore, transmission loss caused by reflection of high frequency signals can be reduced, and a circuit board for high frequency signals that can efficiently transmit high frequency signals can be realized.

DETAILED DESCRIPTION OF THE PREFERRED EMBODIMENTS

The present invention will be explained according to the attached drawings in order to describe it in more detail.

Embodiment 1.

Figure 1:
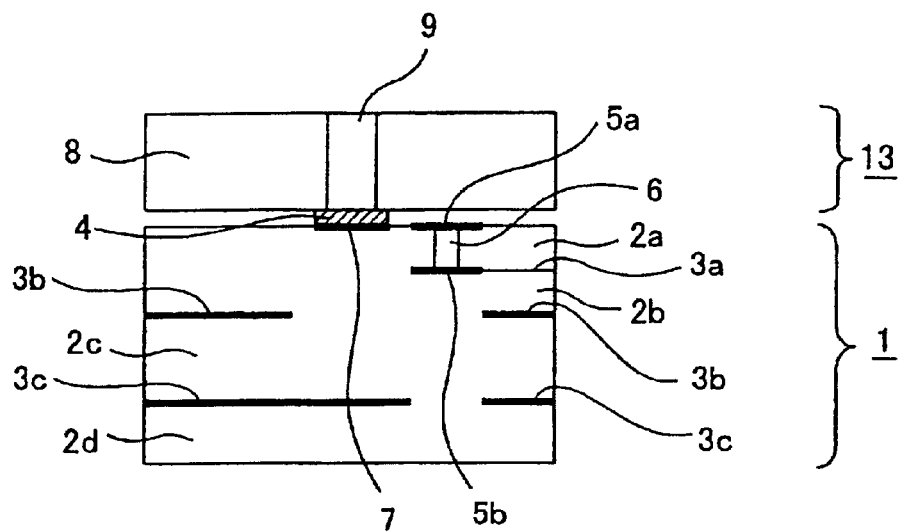
FIG. 1 is a sectional view illustrating a structure of a circuit board for high frequency signals relevant to the invention.

FIG. 1 is a sectional view illustrating the makeup of a multilayer circuit board for high frequency signals relevant to the present invention. Such a multilayer circuit board for high frequency signals is configured by a multilayer wiring board unit 1 and a connector unit (connector on the multilayer circuit board for high frequency signals) 13. Here, as an example of a multilayer circuit board for high frequency signals, a configuration including a multilayer wiring board unit 1 equipped with three inner/surface layers will be explained. More specifically, the multilayer wiring board unit 1 is configured by three inner/surface layers 3a through 3c including a wiring layer 3a having transmission lines (not shown in the figure) for transmitting high frequency signals and ground layers 3b and 3c, and four insulating layers 2a through 2d. Additionally, on the surface of the insulating layer 2a disposed in the episurface of the multilayer wiring board unit 1, a pad (first external electrode) 7 and a land 5a electrically connected to the pad 7 through wiring are formed. The pad 7 is provided for electrical connection to a solder blob portion 4 (connector-side external electrode: second external electrode) provided on the connector unit 13 side. Moreover, directly below the land 5a a via hole 6 is formed and electrically connected to a land 5b (internal electrode). The land 5b is electrically connected to the transmission lines for transmitting high frequency signals, provided on the wiring layer 3a. The solder blob portion 4 is formed on the connector unit 13, on the surface (undersurface in the figure) of an insulating layer 8 in which a signal pin 9 is embedded, and the solder blob portion 4 is electrically connected to the pad 7 on the multilayer wiring board unit 1, whereby the multilayer wiring board unit 1 and the connector unit 13 are electrically connected.

Figure 2:
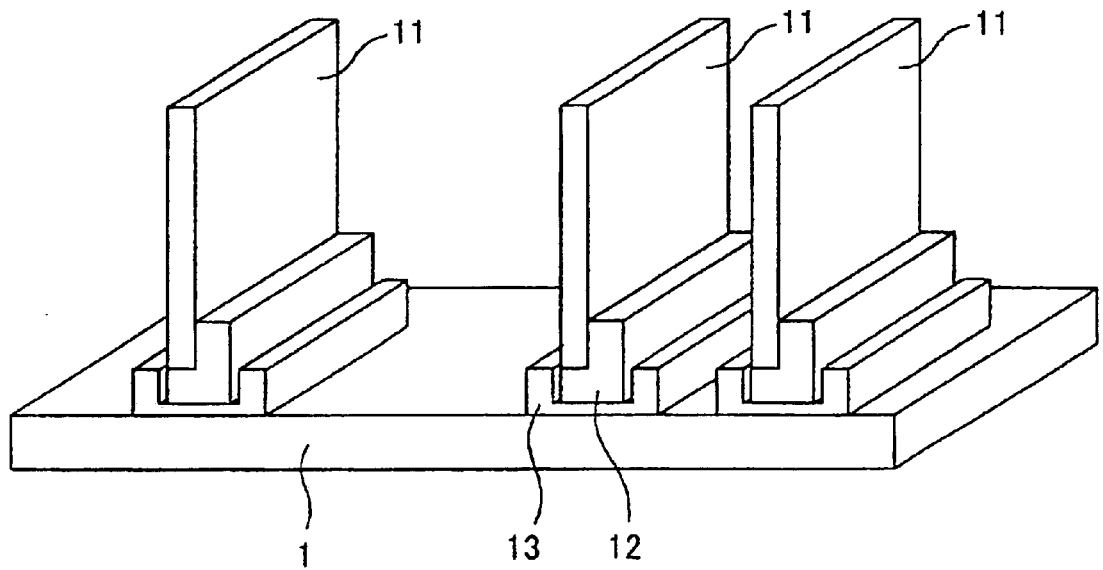
FIG. 2 is a perspective view representing the way in which the circuit board for high frequency signals relevant to the invention connects with daughter cards.

FIG. 2 is a diagram illustrating the way in which such a multilayer circuit board for high frequency signals connects with opposing circuit boards. The header-side connector (connector on the multilayer circuit board for high frequency signals: connector unit) 13 installed on the multilayer wiring board unit (backboard) 1 in the multilayer circuit board for high frequency signals, and a receptacle-side connector (connector on a daughter card: external connector) 12 electrically connected to the opposing circuit board—the daughter card 11 (external circuit board)—are electrically connected. Namely, FIG. 1 illustrates details of the connecting structure between the multilayer wiring board unit 1 and the connector unit 13 in FIG. 2.

In such a configuration, when transmitted signals turn out to be high frequency signals higher than 500 MHz, e.g. from 500 MHz to around 5 GHz, it becomes important to design for impedance matching in electrical connection between the multilayer wiring board unit 1 and the connector unit 13. The reason is as follows. Here, impedance matching means to match the impedance value of the signal sending end and the impedance value of the signal receiving end in transmitting alternate current signals.

More specifically, normally, when transmitted signals are signals of frequency up to the level of several hundred MHz, loss in the transmitted signals because of the difference between impedance values of the signal sending end and the signal receiving end hardly arises. When transmitted signals turn out to be high frequency signals higher than 500 MHz, however, mismatch of the impedance values of the signal sending end and the signal receiving end causes power loss in the transmitted signals for the following reasons. If such power loss in the transmitted signals arises, the signals transmitted from the backboard 1 to the daughter card 11 are not accurately transmitted.

The reason why such power loss in the transmitted signals arises is that when transmitted signals are high frequency signals, if the impedance values of signal sending end and the signal receiving end differ, a phenomenon in which reflection of high frequency signals is repeated between the signal sending end and the signal receiving end arises. It is known, however, that when impedance matching between the signal sending end and the signal receiving end is achieved, alternate current signals that are transmitted never reflect, and the power loss will be minimized.

Therefore, when transmitting high frequency signals, typically, the impedance values of the signal sending end and the signal receiving end are designed so as to be matched. Moreover, when a connector or the like for signal transmission is present between the signal sending end and the signal receiving end, not only the impedance values of the signal sending end and the signal receiving end, but also the impedance value of the connector are designed so as to be matched. For the reasons as described above, in order to transmit high frequency signals higher than 500 MHz, impedance matching between the multilayer wiring board unit 1 and the connector unit 13 must be designed for.

Next, the difference with a conventional connection using pins will be described. If a connection using pins is utilized in transmitting high frequency signals, in view of the electrical circuitry, pin portions sticking out of the layer for transmitting signals are equivalent to stubs in high frequency signal transmission theory, and adversely affect transmission characteristics. Accordingly, when transmitting high frequency signals higher than 500 MHz, a connection without using pins, more specifically, an electrical connection method that constitutes no stubs in view of the electrical circuitry is needed. Therefore, for connection between the multilayer wiring board unit 1 and the connector unit 13 relevant to the invention, a structure is adopted where an external electrode (solder blob portion) 4 with a BGA structure is provided on the header-side connector unit 13, and a pad 7 is provided as an external electrode on the multilayer wiring board unit 1, whereby the solder blob portion 4 and the pad 7 are electrically connected.

Here, the crucial point is to configure the multilayer wiring board unit 1 so that between the insulating layers 2a through 2d directly below the pad 7, a conductive material (e.g. Cu, Al, Au, or W) constituting the ground layer is present only in the position where impedance matching can be achieved. More specifically, here, the distance d from the undersurface of the pad 7 to the ground layer 3c corresponds to the distance where impedance matching can be achieved. To configure the board so that the conductive material is present only in the position where impedance matching can be achieved, such methods are available as a method of adjusting thickness of the insulating layer or the total number of wiring lines so as not to dispose the ground layer in the position where impedance matching cannot be achieved, and a method of removing, by patterning, the portion of the ground layer perpendicularly below the pad 7.

The position where impedance matching can be achieved maybe calculated according to the following method. For example, given that $Z_c$ is impedance of the external electrodes. (here, the sum of impedances of the solder blob 4 and the pad 7), and that $Z_L$ is impedance of the transmission lines, then the reflection coefficient $\Gamma$ can be expressed as the following equation.

$$\Gamma = \frac{Z_L - Z_c}{Z_L + Z_c} \quad (1)$$

When $\Gamma=0$ in the foregoing equation, reflection is zero, which means that impedance matching is achieved. Namely, when $Z_c=Z_L$, impedance matching can be achieved. Strictly speaking, although the impedance $Z_c$ of the external electrodes is determined by the shapes (structure) of the solder blob 4 and the pad 7, it can be calculated simply, as an equation (2), mainly from the ratio of the inductive component (L) to the capacitive component (C).

$$Z_c = \sqrt{\frac{L}{C}} \quad (2)$$

In this case, the L component is determined by the shapes (structure) of the solder blob 4 and the pad 7. Normally, the pad 7 is planar, and the inductive component thereof is smaller than that of the solder blob 4 and negligible, whereby the inductive component $L_e$ of the solder blob 4 can be substituted into the equation. More specifically, given that a is the radius of the solder blob 4, and l is the length thereof, then the $L_e$ component can be calculated from the following equation (3).

$$L_e = \frac{\mu_0}{2\pi}\left\{l\log\left(\frac{l+\sqrt{a^2+l^2}}{a}\right) - \sqrt{a^2+l^2} + a\right\} \quad (3)$$

Although the C component is determined by the position of the ground layer, and a more precise derivation requires taking into consideration the influence by the other grounding layers, because the component of capacitance $C_e$ with the ground layer perpendicularly below the solder blob 4 (or the pad 7) may be presumed to be dominant, given that $\in_0$ is the electric constant, $\in_r$ is the relative permittivity, d is the distance from the ground layer to the pad, and r is the pad radius (radius of the solder blob 4 when the radius of the solder blob 4 is larger than that of the pad), then the C component can be calculated simply from the following equation (4).

$$C_e = \varepsilon_0 \varepsilon_r \frac{\pi r^2}{d} \quad (4)$$

More specifically, because changing the position of the ground layer varies the value d, the $C_e$ component varies, which enables $Z_c$ to be brought close to $Z_L$. Since this can achieve impedance matching, reflection will be reduced, and degradation even in high speed transmission will be reduced.

Combining some of the equations above leads to the following equation (5).

$$d_c = \pi r^2 \varepsilon_0 \varepsilon_r \frac{z_L^2}{L} \quad (5)$$

Here, $d_c$ is a calculated value of the distance d where tolerance of the impedance ($\Delta Z$) is zero, $\in_0$ is the electric constant, $\in_r$ is the relative permittivity, r is the radius of the solder blob or the pad, whichever is greater, $Z_L$ is the impedance of the transmission lines, and $L_e$ is the inductance of the solder blob and the pad.

Therefore, if a conductive material (ground layer) is disposed at the distance $d_c$ determined by the above-mentioned equation (5) perpendicularly below the pad 7, signal transmission to the pad 7 is never affected by a signal being partially transmitted into and reflected in the insulating layers 2a through 2d, which enables efficient signal transmission between the multilayer wiring board unit 1 and the connector unit 13.

In FIG. 1 the configuration is so that the distance from the undersurface of the pad 7 to the ground layer 3c is determined to be $d_c$. That means, in short, the distance $d_c$ is a distance between the ground layer and the pad that achieves the desired impedance value $Z_L$.

It would be appreciated that, in practice, in transmitting high frequency signals higher than 500 MHz, in particular, up to the 5 GHz level above 500 MHz, slight mismatch of the impedance $Z_L$ will not be that big of a problem. In such a case, mismatch of around plus or minus 10Ω with respect to the impedance value $Z_L$=50Ω that applies in a normal circuit board for high frequency signals is tolerable, whereby according to the equation (5), impedance matching can be achieved if the distance d is within the range from 0.6 $d_c$ to 1.5 $d_c$. Moreover, when the signal is further higher, mismatch of around plus or minus 5Ω with respect to the impedance value $Z_L$=50Ω is often tolerable, whereby further impedance matching can be achieved if the distance is within the range from 0.8 $d_c$ to 1.2 $d_c$. Namely, in a case where mismatch of the impedance value $Z_L$ around plus or minus 10Ω with respect to the center value 50Ω is tolerable, if the distance d between the undersurface of the pad 7 and the ground layer 3c is within the range 0.6 $d_c \leq d \leq 1.5 d_c$, desired impedance matching can be achieved. Furthermore, in a case where mismatch of around plus or minus 5Ω is tolerable, if the distance d is within the range 0.8 $d_c \leq d \leq 1.2 d_c$, desired impedance matching can be achieved.

In addition, if a ground layer has to be disposed perpendicularly below the pad 7 in a position other than the position defined by the value d where impedance matching can be achieved, the corresponding portion of the ground layer needs to be removed. Theoretically, a portion perpendicularly under the pad 7 of size corresponding to the pad 7 would have to be removed, but practically, in consideration of patterning accuracy, a little larger portion should be removed. For example, when misalignment in process is assumed to be ±0.1 mm, a portion around 0.2 mm larger than the pad radius should be removed.

It should be noted that, as for connectors in the embodiment above described, although the backboard 1 side is the header-side and the daughter card 11 side is the receptacle-side, the header and the receptacle can be swapped. Namely, the backboard 1 side may be the receptacle-side, and the daughter card 11 side may be the header-side.

Moreover, although in the embodiment above described, for connection between the multilayer wiring board unit 1 and the connector unit 13, the header-side connector unit 13 is equipped with the external electrode (solder blob portion) 4 having a BGA structure, and the pad 7 is installed as the external electrode of the multilayer wiring board unit 1, it is obvious that the header-side connector unit 13 may be equipped with a pad, and as the external electrode of the multilayer wiring board unit 1, an external electrode (solder blob portion) with a BGA structure may be installed. In this case, the value d corresponds to the distance from the surface of the insulating-layer side of the solder blob portion that is the external electrode of the multilayer wiring board unit 1, and can be calculated according to the method in the embodiment described above.

Furthermore, the land 5a connected to the pad 7 on the surface of the insulating layer 2a is electrically connected to the land 5b through the via hole 6. Because the land 5a is electrically connected to the pad 7 on the surface of the insulating layer 2a, in order to efficiently transmit high frequency signals, such a land portion should be preferably provided with the same makeup as the pad 7. Namely, also perpendicularly below the land 5b, a conductive material should be preferably disposed only in the position where impedance matching can be achieved. Because the via hole 6 and the land 5b are present below the land 5a, by calculating the inductive component $L_v$ of the via hole portion according to the following equation, by calculating the inductive component $L_e$ of the land portion according to the equation (3) where r is the land radius, and by substituting these two inductive components $L_e+L_v$ for L in the equation (5), the distance $d_c$ perpendicularly below the land 5b where impedance matching is achieved can be calculated. It should be noted that the inductive component $L_v$ of the via hole portion can be calculated from the following equation (6).

$$L_v = 0.13\, h(\ln(4\, h/r_d)+1) \quad (6)$$

Here, h is the via hole length (depth: m), and $r_d$ is the via hole diameter (m).

Perpendicularly below the land 5b in FIG. 1 no conductive material is disposed, because the figure illustrates a case where the thickness of the insulating layer directly below the land 5b is less than 0.6 $d_c$.

Figure 3:
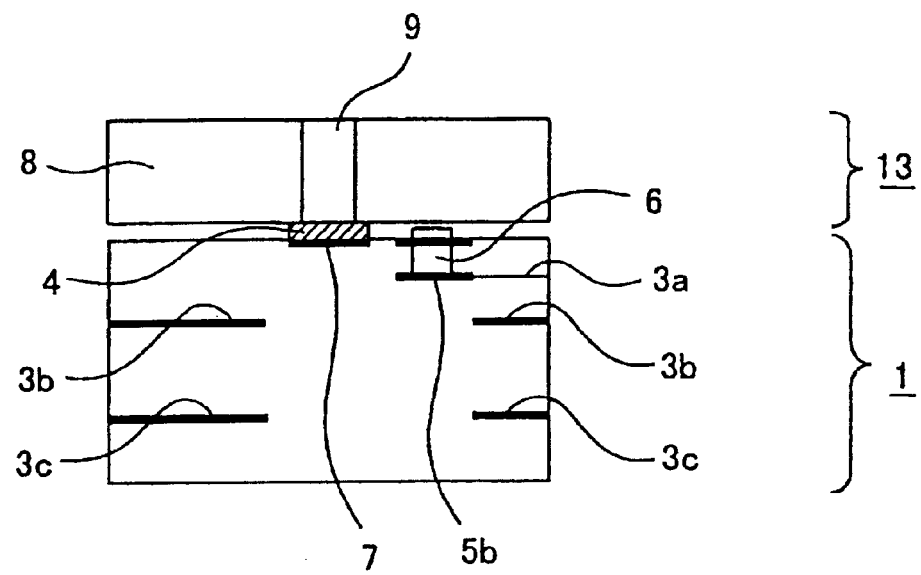
FIG. 3 is a sectional view illustrating a structure of a circuit board for high frequency signals relevant to the invention.

Moreover, FIG. 3 is a sectional view illustrating another embodiment of the circuit board for high frequency signals relevant to the invention. In FIG. 3 no conductive material is disposed perpendicularly below the pad 7 or perpendicularly below the land 5b, which means that both the thickness of the insulating layer below the pad 7 and the thickness of the insulating layer below the land 5b are less than the distance 0.6 $d_c$ where impedance matching can be achieved.

As described above, in the circuit board for high frequency signals relevant to the invention, the ground layer configured by a conductive material disposed below the pad, which causes reflection of high frequency signals, is disposed, as for perpendicularly below the pad, only in the position where impedance matching with the solder blob electrically connected to the pad is achieved, whereby transmission loss caused by reflection of high frequency signals is reduced, so that a circuit-board for high frequency signals that can efficiently transmit high frequency signals is realized.

Embodiment 2.

Figure 4:
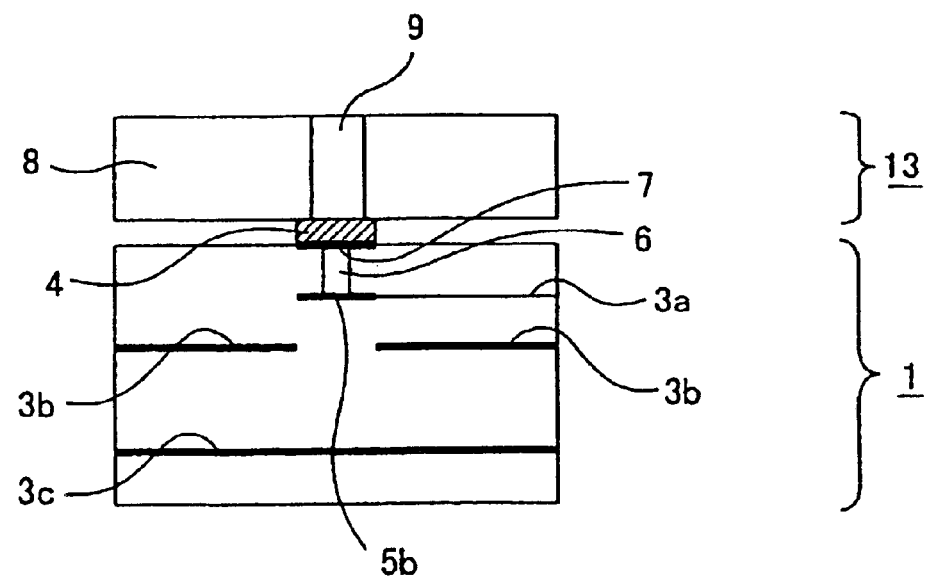
FIG. 4 is a sectional view illustrating a structure of a circuit board for high frequency signals relevant to the invention.

FIG. 4 is a diagram illustrating another embodiment of a circuit board for high frequency signals relevant to the invention. Differing from the makeup in FIG. 1 described in Embodiment 1, FIG. 4 illustrates a makeup where a via hole 6 is formed directly below the pad 7 in the multilayer wiring board unit 1. In such a makeup, by substituting for $L_e$ in the equation (5) the inductive component $L_e$ of the solder blob portion 4 and the pad 7 plus the inductive component $L_v$ (unit: nH) of the via hole portion defined by the equation (6) above described, in the same way as in Embodiment 1, the value $d_c$ can be calculated. Therefore, as in Embodiment 1, when mismatch of around plus or minus 10Ω with respect to the impedance value $Z_L=50Ω$ that applies in a normal circuit board for high frequency signals is tolerable, according to the equation (5), if a conductive material (ground layer) is disposed within the range 0.6 $d_c \leq d \leq 1.5$ $d_c$ away from the land 5b (internal electrode) installed below the pad 7, impedance matching can be achieved. When mismatch of around plus or minus 5Ω with respect to the impedance value $Z_L=50Ω$ is tolerable, if a conductive material is disposed within the range 0.8 $d_c \leq d \leq 1.2$ $d_c$ away from the land 5b installed below the pad 7, impedance matching can be achieved. In FIG. 4, if the distance d between the land 5b and the ground layer 3c is within the range 0.6 $d_c \leq d \leq 1.5$ $d_c$, preferably within the range 0.8 $d_c \leq d \leq 1.2$ $d_c$, impedance matching can be achieved.

As described above, according to the circuit board for high frequency signals relevant to the invention, with a "pad on via" makeup where a via hole is present below the pad 7, in the same way as in Embodiment 1, transmission loss caused by reflection of high frequency signals can be reduced, so that a circuit board for high frequency signals that can efficiently transmit high frequency signals can be realized.

Embodiment 3.

In Embodiments 1 and 2, given that the tolerable range of the impedance $Z_L$ of the transmission line is a specific range, $Z_L=50Ω \pm 10Ω$, for example, the tolerable distance range in which the ground layer can be disposed with respect to the pad 7 was calculated. However, the tolerable value range $\pm \Delta Z$ of the impedance value $Z_L$ of the transmission line is appropriately determined depending on individual circumstances. Therefore, in a circuit board for high frequency signals relevant to Embodiment 3, in a more universal case, namely, given that the impedance value of the transmission line is $Z_L$ and the tolerance is $\pm \Delta Z$, a tolerable distance range between the pad 7 and the ground layer will be determined.

As described above, when the impedance value is $Z_L$ and the tolerance is $\pm \Delta Z$, the distance d between the ground layer and the pad 7 may be within the range described below:

$$d_l = \epsilon_0 \epsilon_r \pi r^2 (Z_L - \Delta Z)^2 / L_e \quad (7)$$

$$d_u = \epsilon_0 \epsilon_r \pi r^2 (Z_L - \Delta Z)^2 / L_e \quad (8)$$

In the above-described equations, $d_l$ is the lower limit of the tolerable distance between the ground layer and the pad 7, and $d_u$ is the upper limit of the tolerable distance between the ground layer and the pad 7. If the distance d between the ground layer and the pad 7 is within the range $d_l \leq d \leq d_c$, impedance matching can be achieved within an appropriate impedance to be desired, and transmission loss caused by reflection of high frequency signals can be reduced, and thus a circuit board for high frequency signals that can efficiently transmit high frequency signals can be realized.

In addition, the above-described distance relationship between the ground layer and the pads does not have to be satisfied regarding all the pads 7 disposed on the multilayer wiring board unit 1, but it is sufficient that the distance relationship only between the ground layer and the pads 7 that transmit high frequency signals higher than 500 MHz, for example, is satisfied.

What is claimed is:

1. A multilayer circuit board for high frequency signals comprising:
   a multilayer wiring board unit including
      one or more wiring layers, each wiring layer including a transmission line for transmitting high frequency signals;
      one or more ground layers of a conductive material;
      one or more insulating layers, each insulating layer being disposed between one of the wiring layers, and one of the ground layers; and
      a first external electrode on an episurface of the board unit and electrically connected to the transmission line; and
   a connector unit including
      a second external electrode electrically connected to the first external electrode; and
      a fitting portion for retaining on the multilayer wiring board unit one of an external circuit board and an external connector, wherein distance d between the first external electrode and the ground layer closest and perpendicular to the first external electrode is within the range $d_l \leq d \leq d_u$ with respect to values $d_l$ and $d_u$ determined by the following equations:

$$d_l = \epsilon_0 \epsilon_r \pi r^2 (Z_L - \Delta Z)^2 / L_e$$

$$d_u = \epsilon_0 \epsilon_r \pi r^2 (Z_L + \Delta Z)^2 / L_e$$

where
   $\epsilon_0$: electric constant,
   $\epsilon_r$: relative permittivity,
   r: radius of the first or the second external electrode, whichever is greater,
   $Z_L$: impedance of the transmission line,
   $\Delta Z$: impedance tolerance, and
   $L_e$: sum of inductances of the first and the second external electrodes.

2. The multilayer circuit board for high frequency signals according to claim 1, wherein $d_l$ is 0.6 $d_c$ and $d_u$ is 1.5 $d_c$, where the distance $d_c$, when the impedance tolerance $\Delta Z$ is zero, is expressed as the following equation:

$$d_c = \epsilon_0 \epsilon_r \pi r^2 Z_L^2 / L_e.$$

3. A multilayer circuit board for high frequency signals comprising:

a multilayer wiring board unit including
one or more wiring layers, each wiring layer including a transmission line for transmitting high frequency signals;
one or more ground layers of a conductive material;
one or more insulating layers, each insulating layer being disposed between one of the wiring layers, and one of the ground layers;
a first external electrode on an episurface of the board unit and electrically connected to the transmission line; and
an internal electrode disposed directly below the first external electrode and interconnected therewith through a via hole; and a connector unit including
a second external electrode electrically connected to the first external electrode; and
a fitting portion for retaining on the multilayer wiring board unit one of an external circuit board and an external connector, wherein distance d between the internal electrode and the ground layer closest and perpendicular to the internal electrode is within the range 0.6 $d_c \leq d \leq 1.5$ $d_c$, where impedance tolerance $\Delta Z$ is zero, and $d_c$ is determined by the following equations:

$$d_c = \epsilon_0 \epsilon_r \pi r^2 Z_L^2 / (L_e L_v)$$

$$L_v = 0.13\, h / (\ln(4\, h / r_d) + 1)$$

where $\epsilon_0$: electric constant, $\epsilon_r$: relative permittivity, r: radius of the first or the second external electrode, whichever is greater, $Z_L$: impedance of the transmission line, $L_e$: sum of the inductances of the first and the second external electrodes, $L_v$: inductance of the via hole, h: length of the via hole, and $r_d$: diameter of the via hole.

4. The multilayer circuit board for high frequency signals according to claim 1, for signals higher in frequency than 500 MHz.

* * * * *